United States Patent [19]
Zurek

[11] Patent Number: 6,028,769
[45] Date of Patent: Feb. 22, 2000

[54] MULTIPLE INTEGRATED SERVICE UNIT FOR COMMUNICATION SYSTEM

[75] Inventor: Michael W. Zurek, Lakeville, Minn.

[73] Assignee: ADC Telecommunication, Inc., Minnetonka, Minn.

[21] Appl. No.: 08/651,939

[22] Filed: May 20, 1996

[51] Int. Cl.[7] .................................................. H05K 7/20
[52] U.S. Cl. ........................ 361/704; 361/727; 361/732; 174/51; 174/50.51; 385/135
[58] Field of Search ........................... 361/683, 704–710, 361/725, 679–686, 724, 726–728, 730, 736, 741, 752, 788, 796–800, 802, 803, 644; 174/35 R, 51, 252, 50.51, 50.52, 37, 39, 50; 385/134, 135, 136–139, 147, 92, 94; 439/61, 64, 108, 485, 607, 609; 257/659, 660; 333/246, 247; 358/349, 86; 455/3, 6, 6.1, 6.4, 4.1, 4.6

[56] References Cited

U.S. PATENT DOCUMENTS

| | | | |
|---|---|---|---|
| 3,700,820 | 10/1972 | Blasbalg et al. | 179/15 BV |
| 3,717,813 | 2/1973 | Lieberman et al. | 325/3 |
| 3,934,224 | 1/1976 | Dulaney et al. | 340/146 |
| 4,009,343 | 2/1977 | Markey et al. | 179/15 BS |
| 4,090,220 | 5/1978 | Gargini | 358/86 |
| 4,107,470 | 8/1978 | Maruta | 179/15 |
| 4,135,202 | 1/1979 | Cutler | 358/86 |
| 4,290,142 | 9/1981 | Schnee et al. | 455/3 |
| 5,267,122 | 11/1993 | Glover et al. | 361/704 |
| 5,343,361 | 8/1994 | Rudy et al. | 361/710 |
| 5,351,245 | 9/1994 | Pregont et al. | 371/5.1 |
| 5,455,739 | 10/1995 | Barden | 361/719 |
| 5,499,047 | 3/1996 | Terry et al. | 348/6 |
| 5,553,064 | 9/1996 | Paff et al. | 370/50 |
| 5,592,540 | 1/1997 | Beveridge | 379/184 |
| 5,594,726 | 1/1997 | Thompson et al. | 370/485 |
| 5,659,351 | 8/1997 | Huber | 348/7 |
| 5,828,807 | 10/1998 | Tucker et al. | 385/135 |

FOREIGN PATENT DOCUMENTS

| | | | |
|---|---|---|---|
| 1-319319 | 12/1989 | Japan | H03H 17/02 |
| 5-122700 | 5/1993 | Japan | H04N 7/16 |
| 5-167632 | 7/1993 | Japan | H04L 27/26 |
| 5-207466 | 8/1993 | Japan | H04N 7/173 |
| 96/10303 | 9/1994 | WIPO | H04B 10/207 |

OTHER PUBLICATIONS

Williamson, J., "Big Business Drives U.K. Local Fiber", *Telephony*, 28–32, (Aug. 28, 1989).

*Primary Examiner*—Leo P. Picard
*Assistant Examiner*—Michael Datskovsky
*Attorney, Agent, or Firm*—Schwegman, Lundberg, Woessner & Kluth P.A.

[57] ABSTRACT

A multiple dwelling or business integrated service unit for a communication system including a hybrid fiber/coax distribution network. The service unit has an enclosure that includes a removable front cover. The enclosure also has a back panel, top and bottom panels, and first and second sides. A plug-in coaxial common electronics module is received in the enclosure's first side. The common electronics module has a structural frame with a cover plate which closes off the first side of the enclosure when the module is plugged in. The unit also has at least one channel card received in the second side of the enclosure. An access panel door removably covers and closes off the second side of the enclosure. The enclosure includes a plurality of radiating fins on its exterior surface for dissipating heat generated in part by the module and the channel unit.

15 Claims, 13 Drawing Sheets

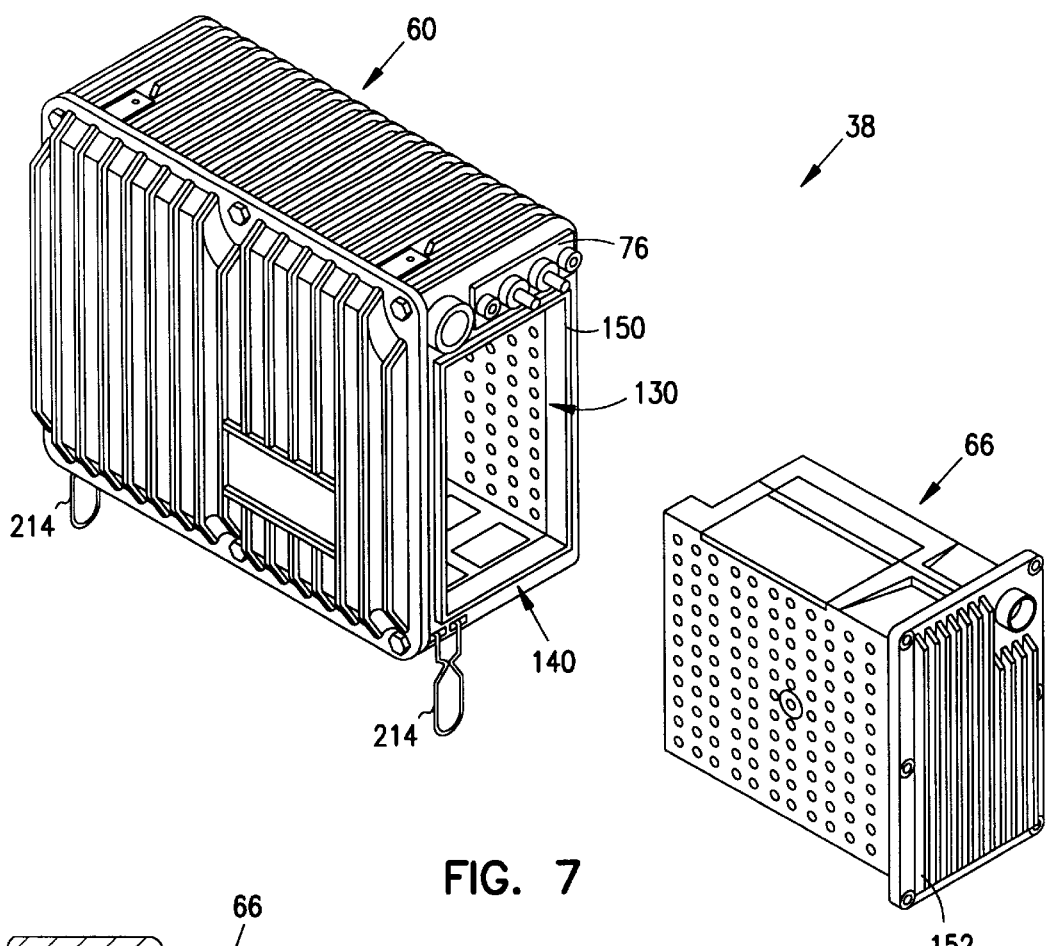
FIG. 7
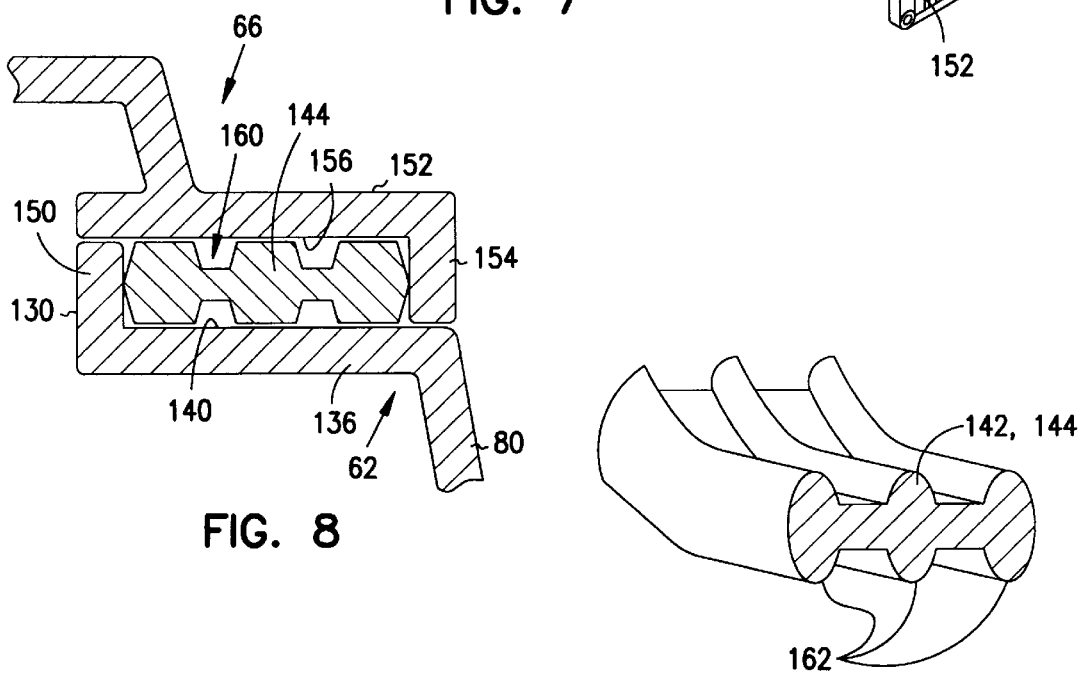
FIG. 8
FIG. 9

MULTIPLE INTEGRATED SERVICE UNIT FOR COMMUNICATION SYSTEM

FIELD OF THE INVENTION

The present invention relates generally to the field of communication systems and more particularly, the present invention relates to a multiple dwelling or business integrated service unit for a communication system with multicarrier telephony transport.

BACKGROUND OF THE INVENTION

Two information services found in households and businesses today include television, or video, services and telephone services. Another information service involves digital data transfer which is most frequently accomplished using a modem connected to a telephone service. All further references to telephony herein shall include both telephone services and digital data transfer services.

Characteristics of telephony and video signals are different and therefore telephony and video networks are designed differently as well. For example, telephony information occupies a relatively narrow band when compared to the bandwidth for video signals. In addition, telephony signals are low frequency whereas NTSC standard video signals are transmitted at carrier frequencies greater than 50 MHz. Accordingly, telephone transmission networks are relatively narrow band systems which operate at audio frequencies and which typically serve the customer by twisted wire drops from a curb-side junction box. On the other hand, cable television services are broad band and incorporate various frequency carrier mixing methods to achieve signals compatible with conventional very high frequency television receivers. Cable television systems or video services are typically provided by cable television companies through a shielded cable service connection to each individual home or business.

An improved communication system utilizing both a fiber optic network and a co-axial cable transmission and distribution network has been developed. The system generally provides both telephony service and video service through the same medium to homes and businesses. The system replaces the prior separate transmission media commonly used today. Such a system is disclosed in co-pending U.S. patent application Ser. No. 08/384,659 filed on Feb. 6, 1995 and assigned to the assignee of the present invention.

The traditional telephony system utilizes a network interface device (NID) usually attached to an exterior wall of a home. The ND receives and transmits telephony signals from and to the junction box and receives and selectively distributes signals from and to the various electronics devices in a home or business such as telephones and computers. A separate video signal is transmitted over a coaxial cable network by the service provider and selectively distributed via shielded co-axial cables routed to subscribing homes and business.

The new system requires a new interface device for housing a modulator-demodulator (modem) which receives and separates the various telephony and video signals and distributes the various signals to the appropriate locations or devices. The modem and other electronics necessary for receiving and transmitting incoming signals must be securely protected from exposure to weather conditions. The electronics of the modem also generate a large amount of waste heat that, if not properly dissipated, causes damage and life reduction or failure of the electronic components of the electronics of the units.

These problems and others, as will become apparent from the description herein, present a need for an improved home integrated service unit for an enhanced communication system.

SUMMARY OF THE INVENTION

The present invention describes a multiple dwelling or business integrated service unit for a communication system including a hybrid fiber/coax distribution network. The service unit in one embodiment has an enclosure that includes a removable front cover. The enclosure also has a back panel, top and bottom panels, and first and second sides. A plug-in coaxial common electronics module is received in the enclosure's first side. The common electronics module has a structural frame with a cover plate which closes off the first side of the enclosure when the module is plugged in. The unit also has at least one channel card received in the second side of the enclosure. An access panel door removably covers and closes off the second side of the enclosure. The enclosure includes a plurality of radiating fins on its interior and exterior surfaces for dissipating heat generated in part by the module and the channel unit.

A coaxial common electronics module of the invention is adapted to plug into an integrated service unit. The module has a structural housing with a cover plate adapted to secure the module to the unit. The housing has a vertically oriented central web extending from the cover plate. A heat sink integrally formed on the housing for conductively connecting to a plurality of electronic packages on the module. A plurality of printed circuit boards are carried adjacent the central web and are adapted to plug into the integrated service unit An interboard connector is carried by the central web for electrically connecting the circuit boards to one another. Some of the electronic packages are carried by one of said boards adjacent the cover plate and the heat sink. An apparatus is attached to the packages for thermally conducting heat from the packages to the heat sink.

An apparatus for providing a thermal conductive path from the printed circuit boards of the module to the structural frame is also disclosed. The apparatus includes a spring member which engages a plurality of electronic packages on the printed circuit board of the module. The spring member also engages a portion of a heat sink of the module. The spring member has a back panel and a plurality of spring fingers which are spaced from and generally parallel to the back panel. The fingers are integrally attached to the back panel along a curved top member. The spring member also includes a plurality of slots in the top member.

The apparatus includes a wedge member having a plurality of projections for insertion through the slots in the top member of the spring member. The projections of the wedge member slip between the electronic packages and the back panel of the spring member. The wedge member projections are each curved in such a manner so as to rock the spring member toward the heat sink variably increasing the amount of load applied to the back panel when the wedge member is inserted. An upper end of the spring member back panel then directly touches the heat sink creating a direct thermally conductive path from the electronic packages to the heat sink.

These and other features of the present invention will become apparent by studying the detailed description, the drawing figures and the appended claims.

BRIEF DESCRIPTION OF THE DRAWINGS

FIG. 7 shows a perspective view of the module side of the MISU of FIG. 2 with the common electronics module removed.

FIG. 8 shows a cross section taken along line 8—8 of the MISU of FIG. 2 illustrating the seal arrangement between the module and the enclosure.

FIG. 9 shows a perspective view of a cross section of the seal grommet illustrated in FIG. 8.

DETAILED DESCRIPTION OF THE PREFERRED EMBODIMENT

Figure 1:
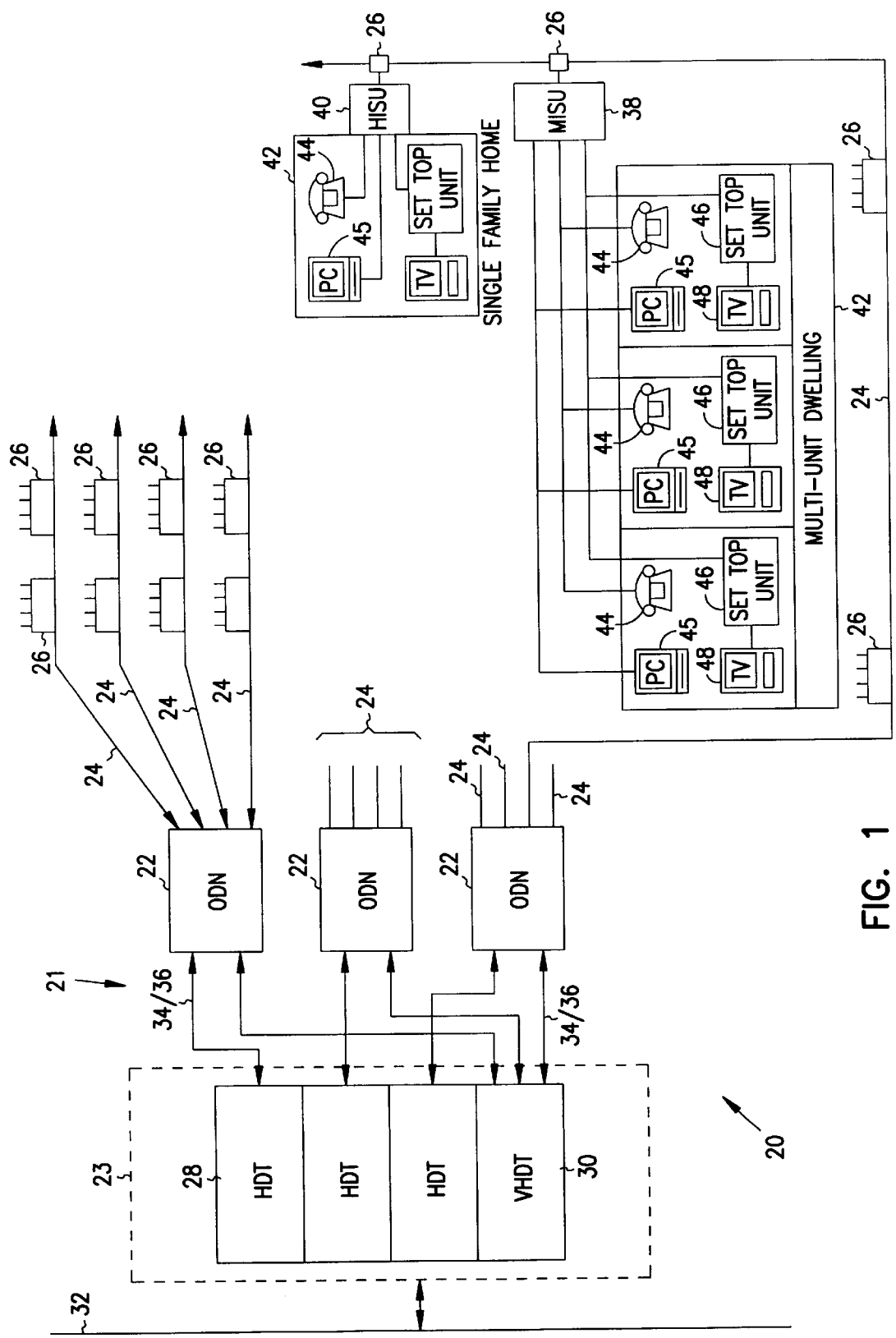
FIG. 1 shows a schematic diagram of a hybrid-fiber/ coaxial telecommunications system incorporating a multiple integrated service unit (MISU) constructed in accordance with the present invention.

A simplified schematic of a communication system 20, as shown in FIG. 1, is an access platform primarily designed to deliver residential and business telecommunication services over a hybrid fiber-coaxial (HFC) distribution network 21. The system 20 is a cost-effective platform for delivery of telephony and video services. Telephony services may include standard telephony, computer data and/or telemetry. In addition, the system is a flexible platform for accommodating existing and emerging services for residential subscribers. Such a system is described in co-pending U.S. patent application Ser. No. 08/384,659, assigned to the assignee of the present invention and incorporated herein by reference in its entirety.

The hybrid fiber-coaxial distribution network 21 utilizes optical fiber feeder lines to deliver telephony and video service to a distribution node 22 (referred to hereinafter as the optical distribution node (ODN)) remotely located from a central office or a head end 23. From the ODNs 22, service is distributed to subscribers via a coaxial network.

Several advantages exist by utilizing the HFC-based communication system 20. By utilizing fiber installed in the feeder, the system 20 spreads the cost of optoelectronics across hundreds of subscribers. Instead of having a separate copper loop which runs from a distribution point to each subscriber ("star" distribution approach), the system 20 implements a bused approach where a distribution coaxial leg 24 passes each home and subscribers "tap" the distribution coaxial leg via a coaxial tap 26 for service. The system 20 also allows non-video services to be modulated for transmission using more cost-effective RF modem devices in dedicated portions of the RF spectrum. Finally, the system 20 allows video services to be carried on existing coaxial facilities with no additional subscriber equipment because the coaxial distribution links can directly drive existing cable-ready television sets. The system is also capable of video service interdiction or transmission on a selective basis to subscribers.

The communication system 20 shall now be generally described with reference to FIG. 1. The primary components of system 20 are host digital terminals (HDTs) 28, video host distribution terminal (VHDT) 30, telephony downstream transmitters (not shown), telephony upstream receivers (not shown), the hybrid fiber coax (HFC) distribution network 21 including optical distribution node 22, integrated service units (ISU) 38 and 40 to which the present invention is directed, and remote customers 42.

The HDT 28 provides telephony interface between the switching network (noted generally by trunk line 32) and the modem interface to the HFC distribution network for transport of telephony information. The telephony downstream transmitters perform electrical to optical conversion of coaxial RF downstream telephony information outputs (not shown) of an HDT 28 and transmits onto redundant downstream optical feeder lines 34. The telephony upstream receivers perform optical to electrical conversion of optical signals on redundant upstream optical feeder lines 36 and applies electrical signals on coaxial RF upstream telephony information inputs (not shown) of HDT 28. The ODN 22 provides interface between the optical feeder lines 34 and 36 and coaxial distribution legs 24. The ODN 22 combines downstream video and telephony onto coaxial distribution legs 24. The integrated services units provide modem interface to the coaxial distribution network and service interface to customers 42.

The HDTs 28 and ISUs 38 and 40 implement the telephony transport system modulator-demodulator (modem) functionality. The remote customers 42, such as homes and businesses, have associated therewith either an ISU 38 or 40, shown generally in FIG. 1, that very simply include means for multiplexing and transmitting upstream electrical data signals including telephony information, such as from telephones 44 and data terminals 45, and in addition may include means for transmitting set top box information from set top boxes 46 connected to video equipment 48. The upstream electrical data signals are provided by a plurality of ISUs to an optical distribution node 22 connected thereto via the coaxial portion of the HFC distribution network 21. The optical distribution node 22 converts the upstream electrical data signals to an upstream optical data signal for transmission over an optical fiber feeder line 36 to the head end 23.

Similarly and very simply, the ISUs include means for receiving and demultiplexing signals downstream from ODNs 22 and selectively distributing the appropriate signals to the various telephone 44, data terminals, and video top set boxes 46. The head end sends optical signals via feeder lines 34 to ODNs 22 where they are converted and transmitted via coaxial legs 24 to coaxial taps 26 and hence the plurality of ISUs 38 and 40.

Two basic types of ISUs are shown in FIG. 1 which provide service to specific customers. Multiple user integrated service units (MISUs) 38 may be a multiple dwelling integrated service unit or a business integrated service unit. The multiple dwelling integrated service unit may be used for mixed residential and business environments, such as multi-tenant buildings, small businesses and clusters of homes. These customers require services such as plain old telephone service (POTS), data services, DS1 services, and standard TR-57 services. Business integrated service units are designed to service business environments because they may require more types of services, for example, data services, ISDN, DS1 services, higher bandwidth services, such as video conferencing, etc.

Home integrated services units 40 (HISUs) are used for residential environments such as single-tenant buildings and duplexes, where the intended services are POTS and basic rate integrated digital services network (ISDN). An improved HISU is described in co-pending U.S. patent application Ser. No. 08/384,659, assigned to the assignee of the present invention. The present invention is directed to a MISU construction for use with a HFC communications system 20 as illustrated in FIG. 1. The function and electronics of the system and of the MISU are described in the co-pending application Ser. No. 08/384,659 previously referred to herein.

Figure 2:
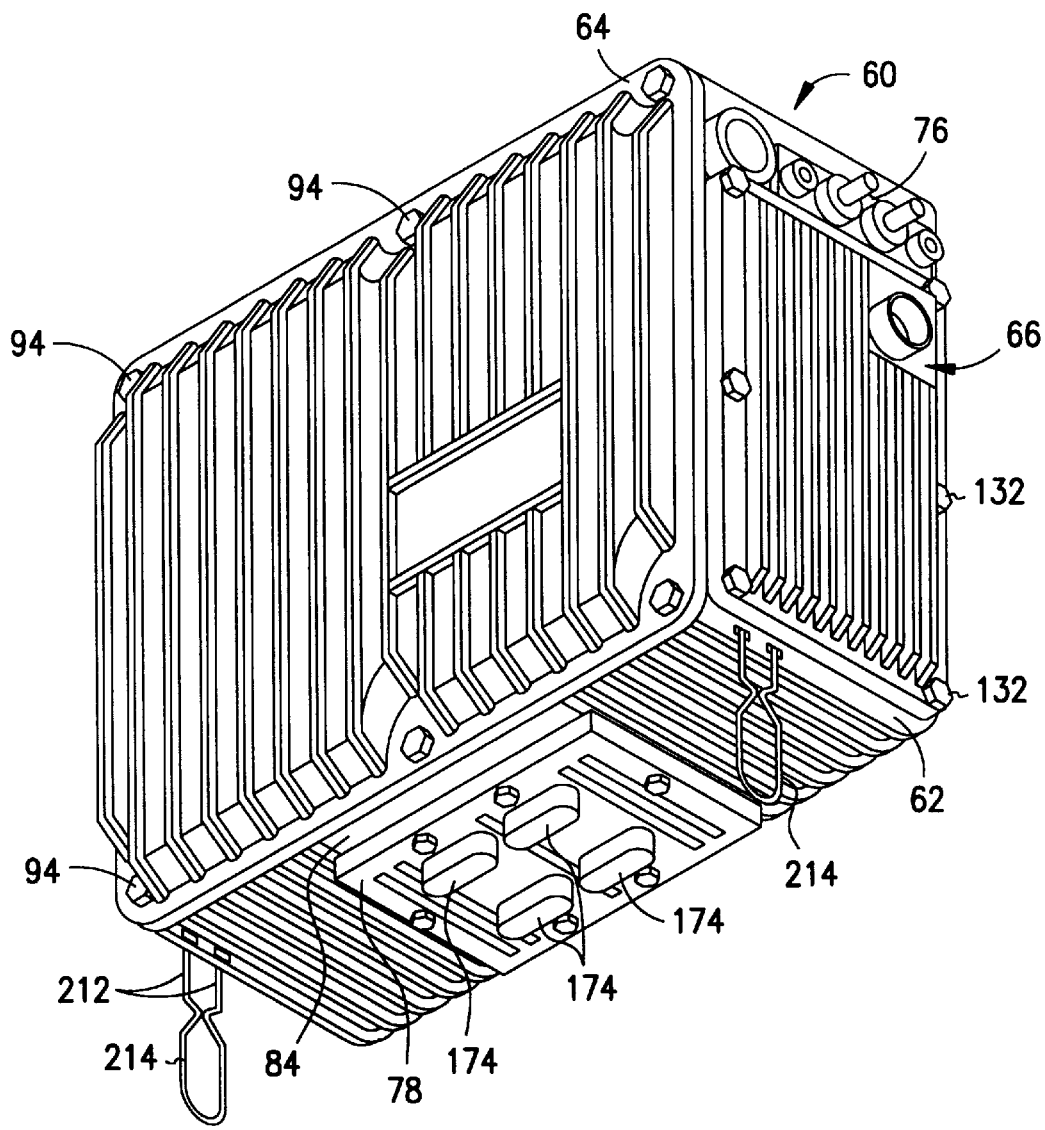
FIG. 2 shows a perspective view of a MISU constructed in accordance with one embodiment of the present invention.
Figure 3:
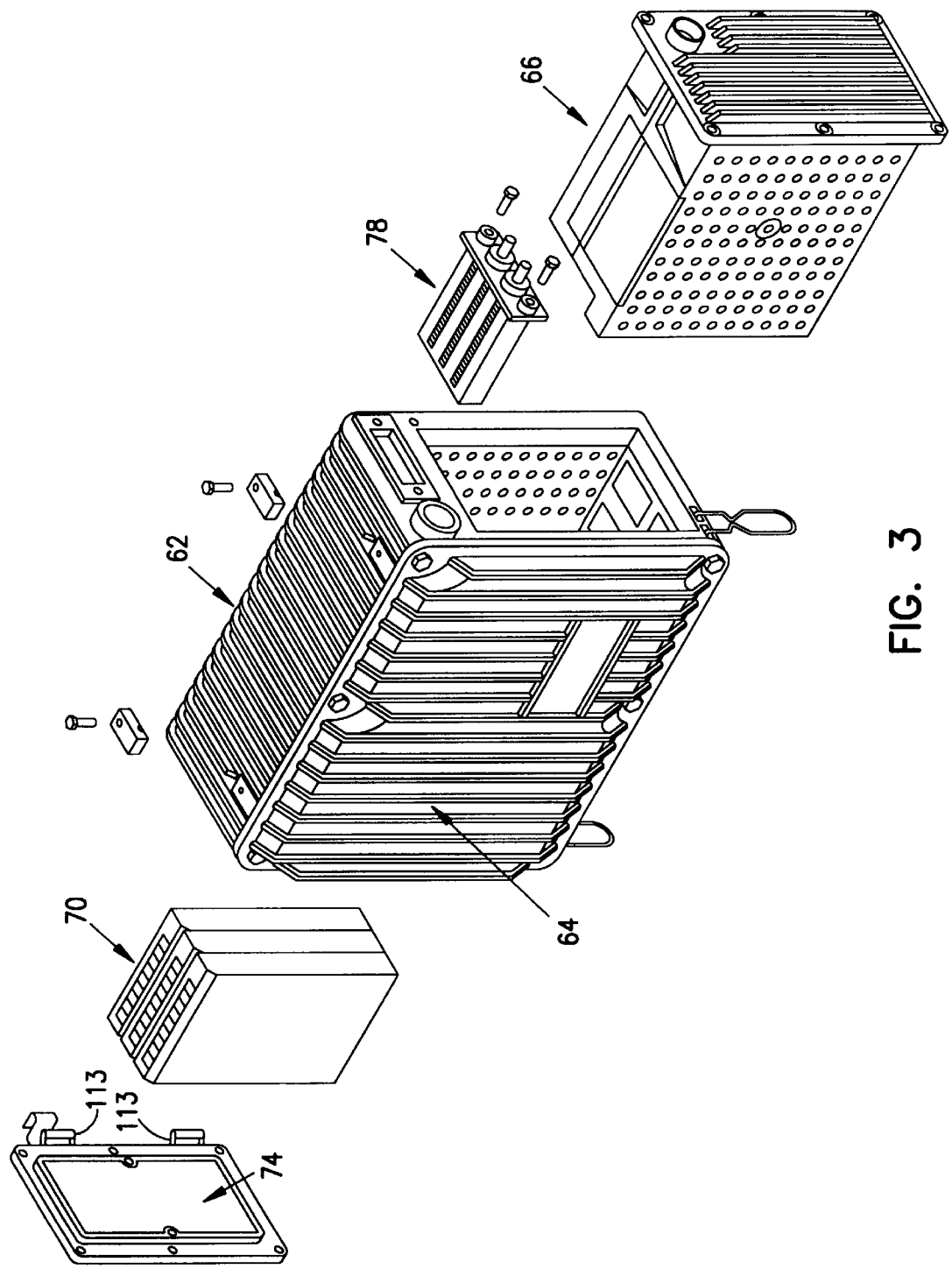
FIG. 3 shows a partially exploded view in perspective of the MISU of FIG. 2.

FIG. 2 illustrates a multiple integrated service unit (MISU) 38 constructed in accordance with one embodiment of the present invention. FIG. 3 illustrates MISU in partially exploded view showing the unit's basic components. MISU 38 includes an enclosure 60 which has a main shell 62 and a front cover 64 secured thereto. MISU 38 also includes a coaxial common electronics module (CXCM) 66 which contains the power supply, modem electronics, common control, RF signal access and monitoring port, alarm reporting, and various other electronics. CXCM 66 is removably inserted into a first side 68 of enclosure 60. A plurality of channel units 70 for providing telephony or data services are received in a second side 72 of enclosure 60 which is disposed opposite first side 60. A channel unit access door 74 is hingedly attached to second side 72 for closing off the second side and securing channel units 70 within the enclosure. CXCM 66 includes its own cover plate 152 which closes off first side 68 of enclosure 60 as is described herein. MISU 38 also includes a video tap plate 74 secured to the bottom of enclosure 60 as will also be described herein. CXCM 66 of the present embodiment has a power protection module (PM) 76 inserted above CXCM 66 in first side 68 for providing lighting protection, fusing, RF input and directional coupling for video signals, and various power connections for MISU 38.

MISU 38 acts both as a receiver and a transmitter in the telecommunications system 20. As a receiver MISU 38 receives mutiplexed signals from the system and demultiplexes the signals before transmitting downstream to subscribers over a coaxial cable system. As a transmitter MISU 38 multiplexes a subscriber signal and sends it upstream over the coaxial cable system to head end 23 of the system for network distribution.

Figure 4:
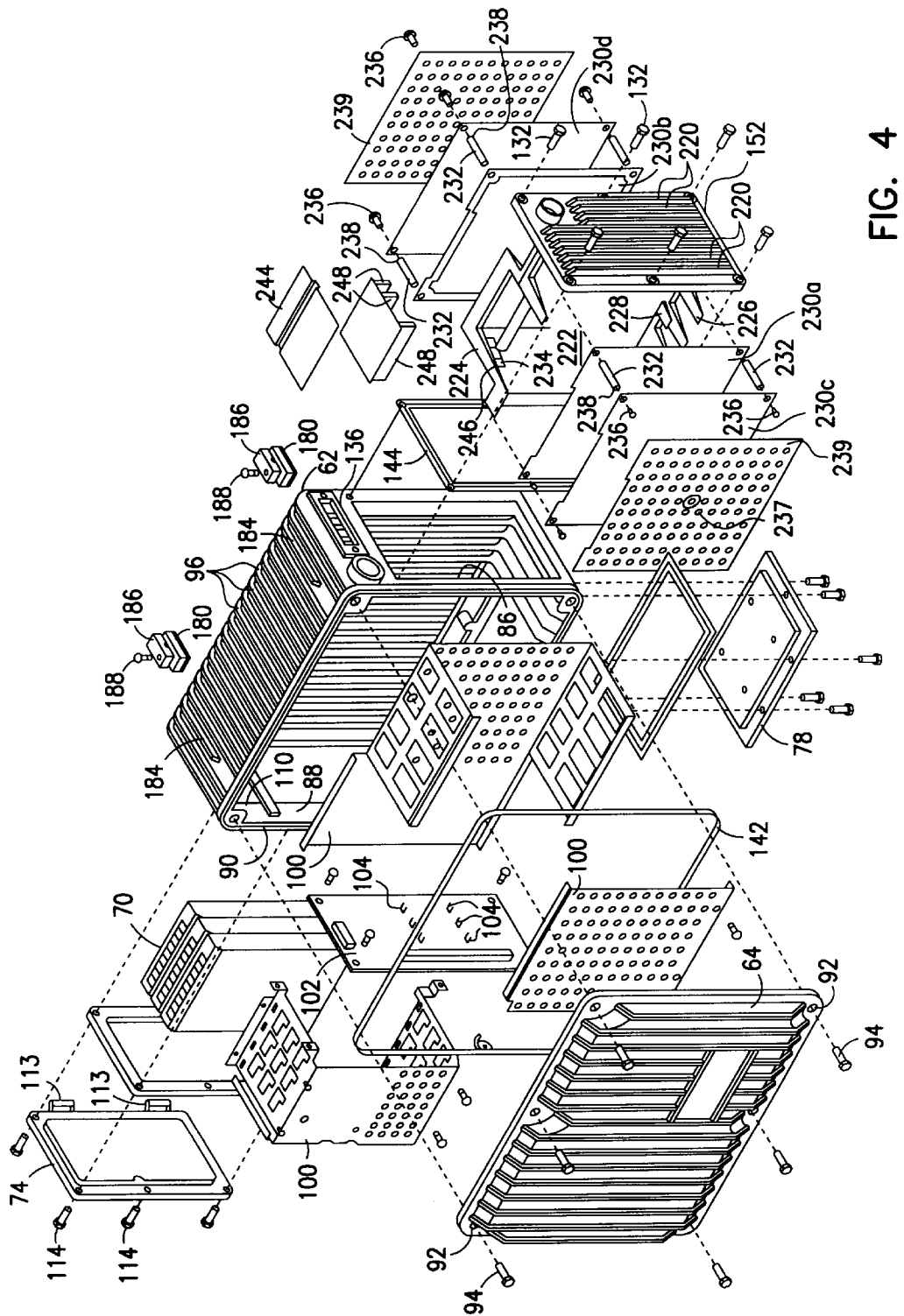
FIG. 4 illustrates an exploded view in perspective of the MISU of FIG. 2.

In one embodiment, enclosure 60 in the present embodiment as illustrated in FIG. 4 includes a back panel 80 which is generally vertically oriented and integrally connected to a generally horizontal top panel 82. Enclosure 60 also includes a bottom panel 84 integrally connected to back panel 80 and disposed generally parallel to and opposite top panel 82. A pair of vertical pillars 86 and 88 interconnect top panel 82 and bottom panel 84 adjacent first side 68 and second side 72, respectively. The front face of enclosure 60 defined by pillars 86 and 88 and the forward free edges of top panel 82 and bottom panel 84 define a continuous front cover interface 90 for mating with front cover 64 when enclosure 60 is assembled.

Front cover 64 is a generally flat rectangular panel with a perimeter shape corresponding to front cover interface 90 of shell 62. Front cover 64 includes a plurality of securing bores 92 for receiving a plurality of fasteners 94 to attach front cover 64 to shell 62. The configuration of shell 62 and front cover 64 may vary without departing from the scope of the present invention as will be evident to those skilled in the art. The size and contour of enclosure 60 is dependent upon the number and size of channel units 70 and the shape and size of CXCM 66 which are to be carried within MISU 38. The enclosure size is also determined by the required thermal dissipation capacity necessary for the particular unit As is illustrated in FIG. 2, 3, and 4, enclosure 60 is formed having a plurality of radiating fins 96 formed on its inner and outer surfaces creating a radiant heat transfer mechanism for dissipating heat generated by the electronic components held within MISU 38. The number, size and contour of fins 96 is determined based on the desired heat transfer characteristics necessary for adequately cooling the electronic components of MISU 38. It is preferable that enclosure 60 is cast from a material such as aluminum to provide a relatively light-weight unit having excellent conductive and radiant heat transfer properties. It is within the purview of the present invention however to utilize other materials such as aluminum alloys, magnesium alloys, thermally conductive plastics or the like to construct shell 62 and cover 64 of enclosure 60.

Figure 5:
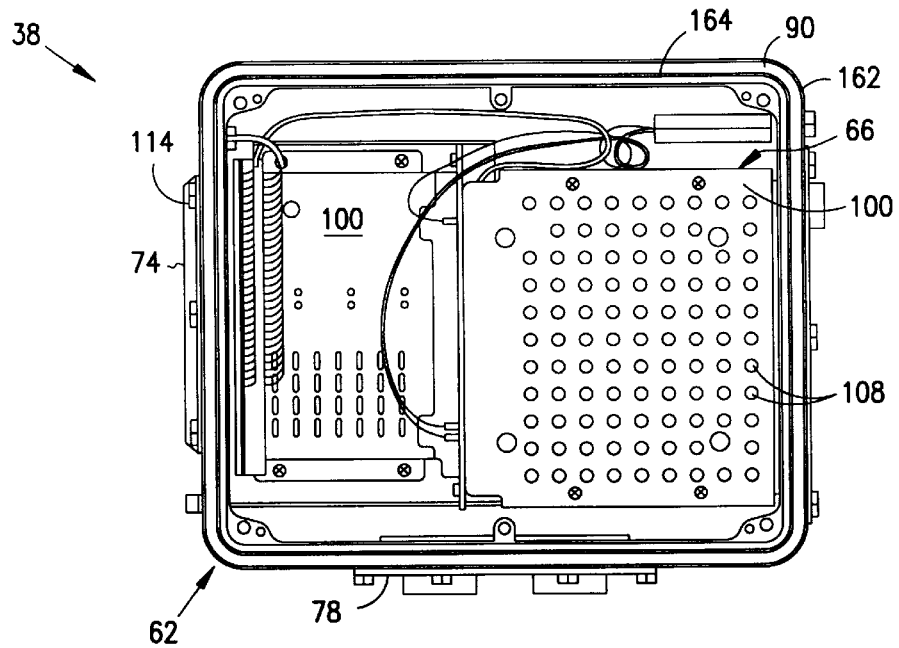
FIG. 5 shows a frontal view of the MISU of FIG. 2 with the front cover of the enclosure removed.

Disposed within enclosure 60 is an inner sheet metal structure or chassis 100 for supporting both CXCM 66 and channel card 70 within the enclosure. In the present embodiment, chassis 100 includes a backplane 102 disposed centrally within chassis sandwiched between CXCM 66 and channel units 70. Backplane 102 has a plurality of connectors 104 facing first side 68 of enclosure 64 for connecting to CXCM 66 when the module is plugged into the first side of enclosure 60. As illustrated in FIG. 5, the opposite side of backplane 102 includes a plurality of connectors 106 for making the various telephony and video connections within MISU 38 as well as alarm connections for sensing whether any doors or panels of the unit are open.

Chassis 100 preferably is formed having a multitude of perforations 108 in the sheet metal for permitting air to flow though the structure helping to transfer heat by convection from CXCM 66 and channel units 70 to enclosure 60 for dissipating the heat to atmosphere. Chassis 100 also provides a radio-frequency (RF) shield helping to reduce electronic interference in the operation of MISU 38. Chassis also provides a vehicle for reducing internal electromagnetic and radio-frequency interference. Chassis 100 is intended to also accommodate manufacturing and build tolerance variations in the MISU 38 components. This permits the cast enclosure components to be manufactured within reasonable and hence less expensive tolerance precision.

Figure 6:
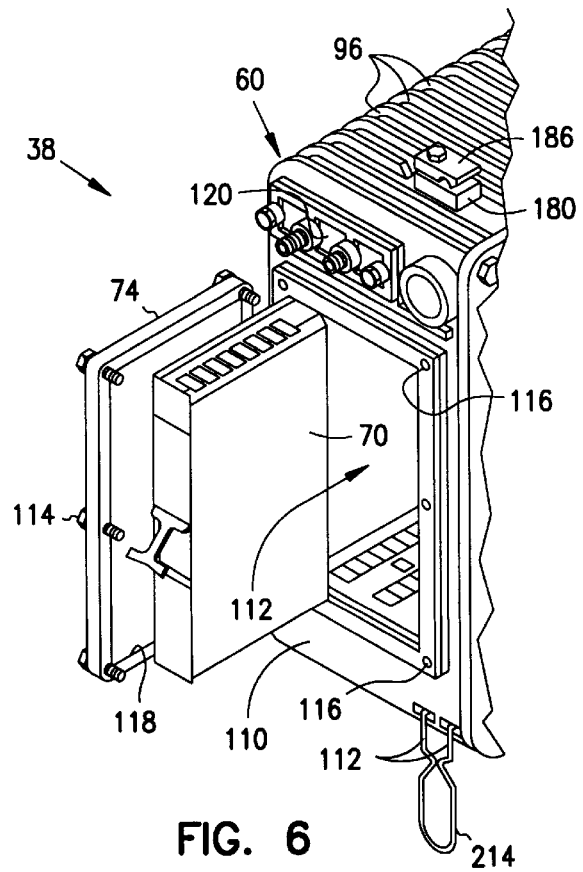
FIG. 6 shows a perspective view of the channel unit side of the MISU of FIG. 2 with the channel unit door opened and a channel unit partially removed

As illustrated in FIGS. 3, 4, and 6, second side 72 of enclosure 60 includes a side panel 110 integrally formed with the enclosure which defines a channel unit opening 112 therein. The channel units 70 are inserted through opening 112 into channel unit slots (not shown) provided within chassis 100. Access door 74 is carried on one or more hinges 113 along one edge of opening 112. When rotated to a closed position, door 74 seals and closes off opening 112 in second side 72 of enclosure 60. Hinges 113 may be provided with a detente feature for holding access door 74 in a desired open position or in its closed position. To secure access door 74 to second side panel 110, fasteners 114 are received through access door 74 along its perimeter for threading into corresponding tapped bores 116 provided in the side panel. Preferably, access door 74 includes a perimeter seal or grommet 118 formed of a rubber-like elastomeric material for providing a weather proof seal between the door and side panel 110.

Second side panel 110 also includes a plurality of electrical connectors 120 disposed above channel unit opening 112 for making various connections between MISU 38 and telecommunications network 20. As will be evident to those skilled in the art, access door 74 and card opening 112 may take on any number of constructions and configurations without departing from the scope of the present invention but must be configured to properly and securely seal off opening 112. Access door 74 may be provided with a plurality of exterior radiating fins formed thereon for dissipating heat from the channel units.

As illustrated in FIGS. 3, 4, and 7, CXCM 66 is received within a module access opening 130 in first side 68 of enclosure 60. CXCM 66 is secured to enclosure 60 by a plurality of fasteners 132 received through securing bores 134 provided in CXCM 66 and which thread into corresponding tapped bores 135 formed in a first side panel 136 of first side 68. As will be described herein CXCM 66 closes off and seals first side 68 of enclosure 60 when plugged into module access opening 130 and secured to the enclosure. One embodiment of CXCM 66 is described in more detail below.

First side panel 136 is integrally formed with the enclosure which defines module access opening 130. First side panel 136 also includes a PPM insert opening 138 disposed above module access opening 130 for receiving therein PPM 76. A module interface surface 140 is formed around the perimeter of access opening 130 for sealingly engaging CXCM 66 when it is inserted into first side 68 of enclosure 60. Front cover interface 90 and module interface 140 are preferably of a similar construction when viewed in cross section. Preferably, interfaces 140 and 90 in conjunction with a rubber grommet 142 for the front cover 64 and 144 for CXCM 66 form a weather tight seal between the respective components.

FIG. 8 illustrates a cross-section of module interface 140 including module grommet 144 when CXCM 66 is secured to enclosure 60. First side panel 136 of enclosure 60 includes a projecting wall 150 around and defining module access opening 130. CXCM 66 includes a cover plate 152 with an inside surface 156 that has a second projecting wall 154. When CXCM 66 is inserted into enclosure 60, second wall 154 is spaced radially outward from and surrounding projecting wall 150. Wall 150 projects module interface surface 140 to a predetermined distance. Second wall 154 projects the same predetermined distance from CXCM cover plate 152. When assembled, inside surface 156 of cover plate 152 and module interface 140 combine with projecting wall 150 and second projecting wall 154 to define a grommet channel 160 having a depth defined by the predetermined distance of the projecting walls. The depth of grommet channel 160 is dependent upon the desired amount of compression of grommet 144.

An alternative or additional manner in which to control the depth of grommet channel 160 is to add a pin projecting from one of the mating components. The pin would abut against the other of the mating components to define a spacing therebetween.

As illustrated in FIG. 9, grommets 142 and 144 each include three seal members or lips 162 extending longitudinally along the grommets and parallel to one another. The grommet thickness defined by the height of seal lips 162 must be at least slightly larger than the depth of channel 160 in order for the grommets to compress. The depth of grommet channel 160 controls the working compression of the grommets when MISU 38 is assembled, thus providing a consistent and durable seal. Too little deflection of the grommets results in an inadequate seal. Too much deflection results in a compression set or creep condition eventually creating leakage. Over deflection also causes warpage of the cover plates. It is within the preview of the present invention for grommet 118 of access door 74 to be constructed identically to grommets 142 and 144.

As will be evident to those skilled in the art, grommet channel 160 may be formed wherein the two mating members such as module cover plate 152 and shell 62 take on different configurations as those illustrated in FIG. 8 and yet define a rectangular channel cross section for grommets 142 and 144. As illustrated in FIG. 5 for example, front cover interface 90 includes an outer projecting wall 164 and a parallel inner projecting wall 166 around the perimeter of the interface defining the grommet channel 160 therebetween. Front cover 64 merely includes a flat or planar inner surface which when secured to shell 62 would define the remaining wall of grommet channel 160.

As illustrated in FIGS. 2, 4, 10 and 11, bottom panel 84 of shell 62 includes a video tap opening 170. Optional video tap plate 76 is secured to bottom panel 84 in a manner similar to that which CXCM 66 and cover plate 64 are secured to shell 62 and may include a similar type of seal as described above for grommets 142 and 144. Video tap plate 76 includes a plurality of video tap connections 172 thereon for tapping off a plurality of video cable service lines therefrom if desired. Tap plate 76 also allows for video signal interdiction for selectively feeding a signal to subscribers via order wire by incorporating RF relays into tap plate 76. If no video connections are desired, an essentially flat plug plate may be substituted for the tap plate and secured to bottom panel 84 without departing from the scope of the present invention. Alternatively, as illustrated in FIG. 2, a video tap protective cover 174 may be inserted over unused video tap connectors 172 allowing for later access if desired.

Figure 10:
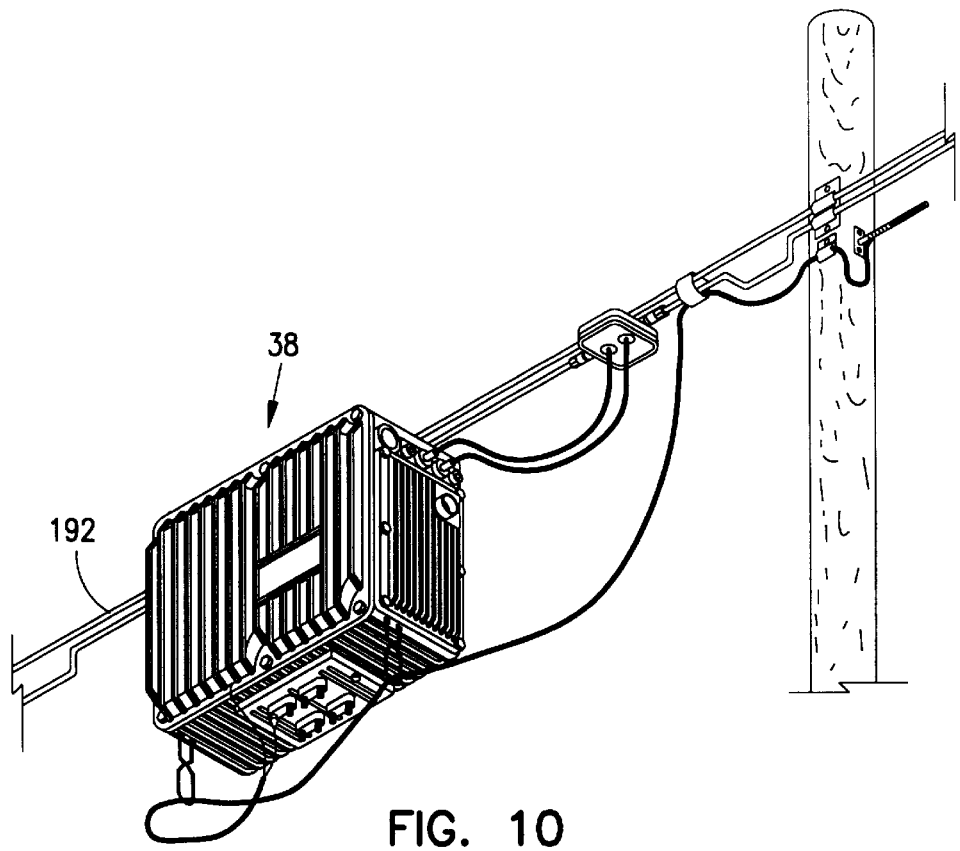
FIG. 10 shows the MISU of FIG. 2 strand mounted to a telecommunications system feeder strand.
Figure 11:
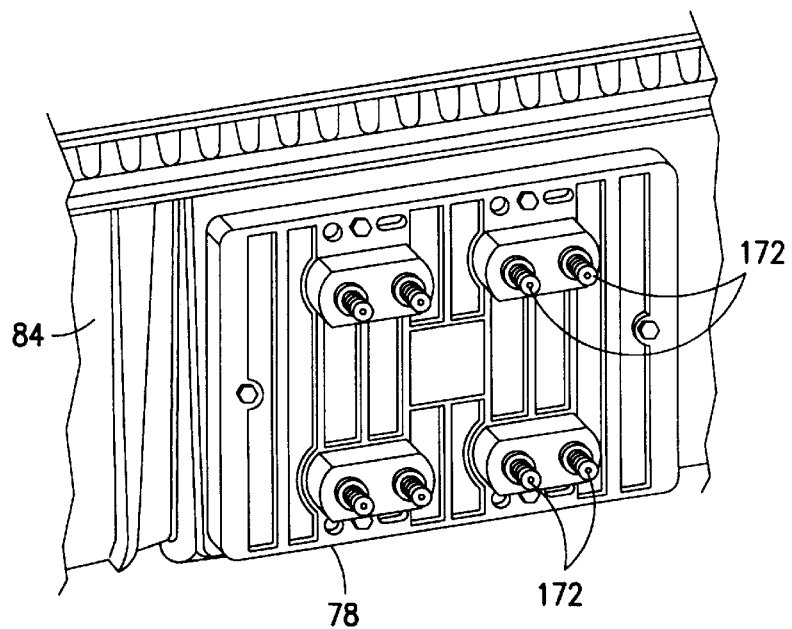
FIG. 11 shows a fragmentary bottom view of the MISU of FIG. 2.
Figure 15:
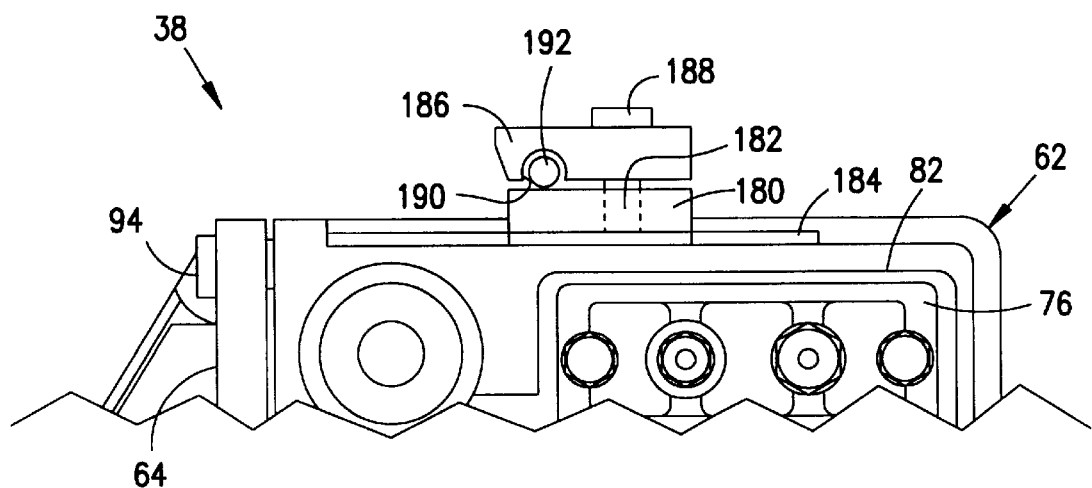
FIG. 15 shows a fragmentary side view of the strand mounted MISU of FIG. 10.

FIGS. 10, and 12–15 illustrate a number of manners in which MISU 38 may be mounted when incorporated into a telecommunications system. FIG. 10 illustrates MISU 38 strand mounted on a feeder strand 192 of the telecommunications system 20 which runs above ground along a system of standard telephone poles. To incorporate a strand mounting system, a pair of slide blocks 180 each having therein a tapped bore 182 are received in slide channels 184 formed on top panel 82 of shell 62. A conventional strand clamp 186 including a securing bolt 188 received through the strand clamp is provided for attaching to each slide block 180. A strand groove 190 as illustrated in FIG. 15 is formed in each strand clamp 186 for receiving feeder strand 192 sandwiched between each strand clamp 186 and each slide block 180.

Figure 12:
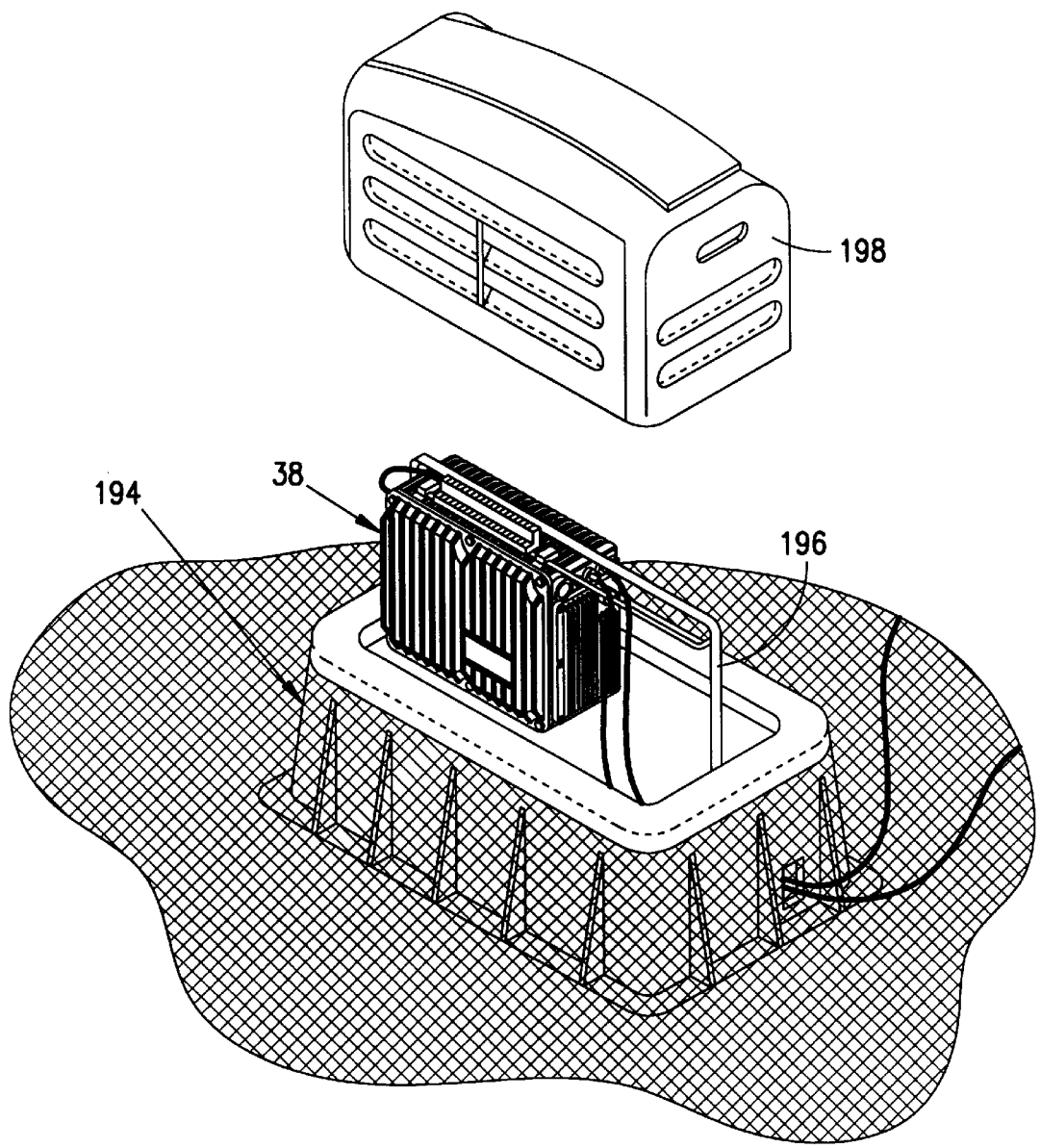
FIG. 12 shows the MISU of FIG. 2 pedestal mounted in a telecommunications system.

FIG. 12 illustrates a below ground or ground level pedestal mounting system including a pedestal base 194 and an above-ground pedestal mounting bracket 196 for supporting MISU 38. Bracket 196 includes a band 197 which is received in strand grooves 190 of strand clamps 186 as described above for supporting MISU 38. A pedestal cover 198 will be provided for protecting the MISU from vandalism or damage caused by the elements.

Figure 13:
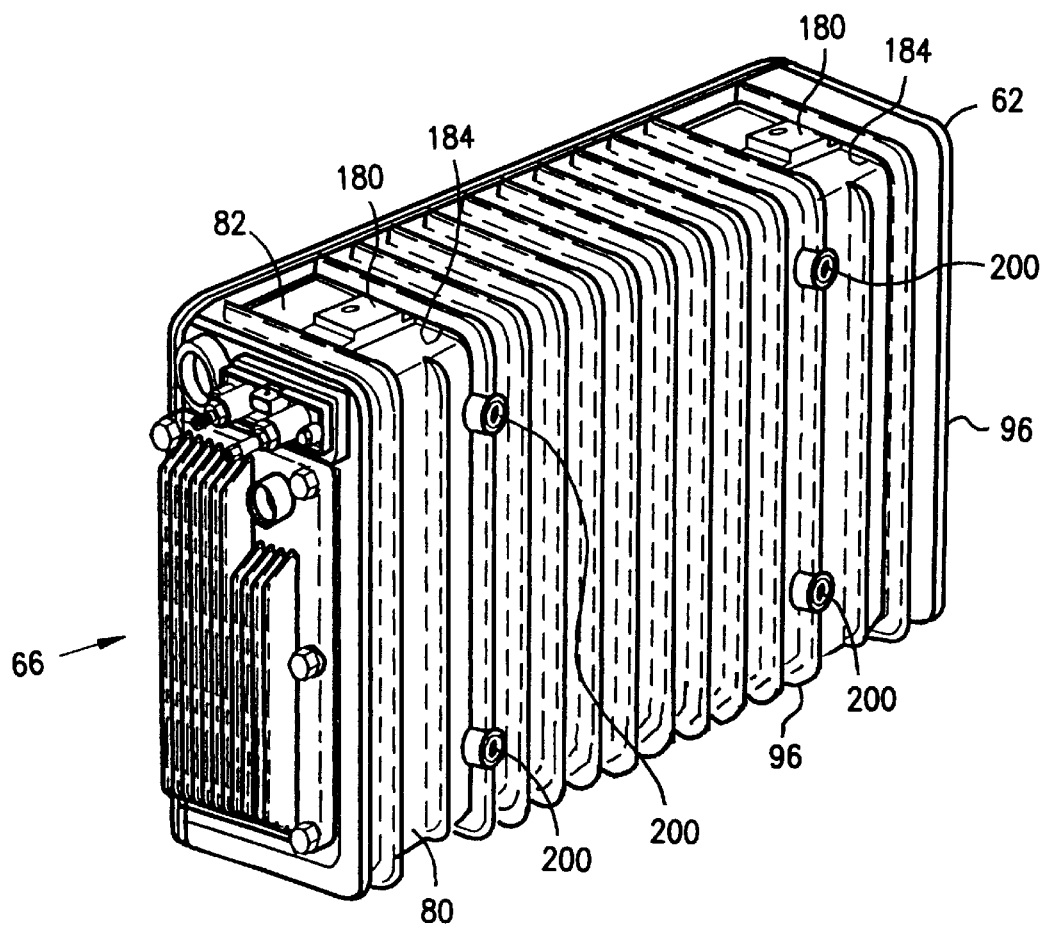
FIG. 13 shows a rear perspective view of the MISU of FIG. 2.
Figure 14:
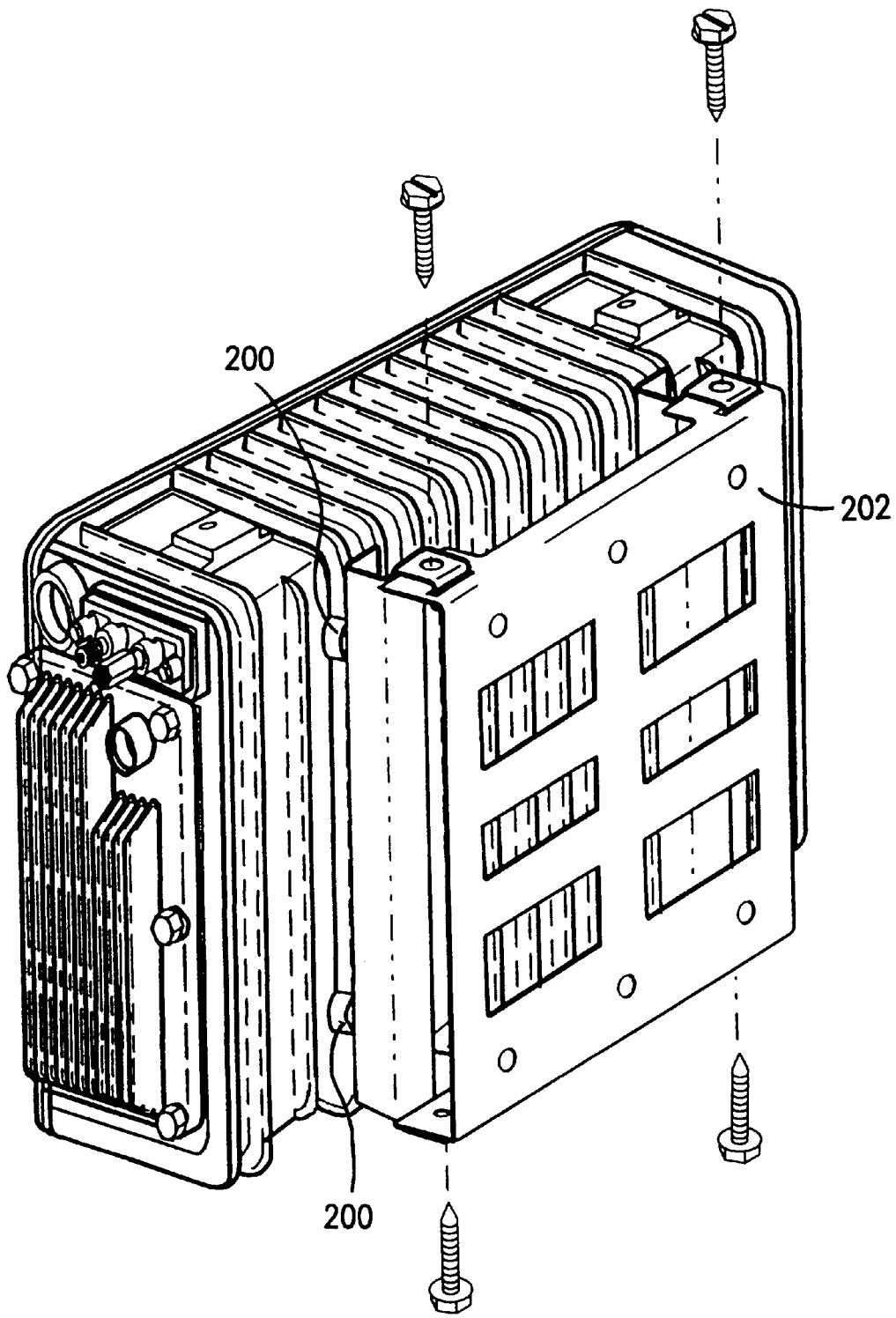
FIG. 14 shows a wall mounting bracket attached to the back panel of the MISU of FIG. 13.

As another alternative for mounting MISU 38, FIG. 13 illustrates back panel 80 of shell 62 having a plurality of tapped mounting bosses 200 formed thereon. Bosses 200 are adapted to receive thereon a mounting bracket 202 such as the one illustrated in FIG. 14 for mounting MISU 38 directly to a wall or vertical surface. Mounting bracket 202 may take on any number of configurations and constructions without departing from the scope of the present invention as those skilled in the art will realize.

As illustrated in FIGS. 6 and 10, each of first and second side panels 136 and 110, respectively, may include a pair of slots 210 adapted to receive free ends 212 of a spring clip 214 therein. Spring clips 214 are preferably utilized as illustrated in FIG. 10 for routing and guiding one or more video cables 216 running from video tap connectors 172 on video tap plate 74 preventing any tensile load which would otherwise be applied to tap connectors 172 by the weight of cables 216.

In another embodiment of the present invention, CXCM 66 is illustrated as assembled in FIGS. 3 and 6 and in exploded view in FIG. 4. CXCM 66 includes a structural support housing 218 which is preferably formed from cast aluminum similar to the other components of enclosure 60 but again may be constructed from other materials without departing from the scope of the present invention. Housing 218 also acts as a heat sink for the electronic components of CXCM 66. Cover plate 152 in the present embodiment is integrally cast as apart of housing 218 and has a plurality of radiating fins 220 formed on the outside surface of the cover plate for conductively dissipating heat from within CXCM 66 to the atmosphere.

As shown in FIG. 4, housing 218 includes a vertically oriented central web 222 extending perpendicularly from the inside surface 156 of the cover plate. Central web 222 includes a U-shaped top frame member 224 disposed on the top edge of and generally horizontal and perpendicular to the central web. A plurality of horizontally projecting members 226 extend perpendicularly in both directions from the bottom edge of central web 222 opposite the top frame member 224. Disposed spaced from and parallel to projecting members 226 on both sides of the web is a projecting tab 228 formed integral with central web 222 and spaced in-board from members 226. Projecting members 226 are for providing a bottom wall for CXCM 66 when assembled which permits air to flow through the CXCM. A plurality of printed circuit boards (PCB) 230a, 230b, 230c and 230d are vertically oriented and mounted within CXCM 66 with boards 230a and 230b adjacent central web 222 and boards 230c and 230d spaced outwardly form the inner boards. Projecting tabs 228 mate with a corresponding indent 231 on an edge of each of inner PCBs 230a and 230b to aid in properly orienting and positioning the PCB's when CXCM 66 is assembled. Projecting tabs 228 may also provide an additional heat sink for another electronic package not positioned adjacent cover plate 152 and cannot be connected to the heat sink apparatus described below.

PCBs 230a through 230d are attached essentially parallel to central web 222 stacked on either side thereof. Boards 230a and 230c and boards 230b and 230d are held spaced apart by spacing fasteners 232 which secure the inner PCBs 230a and 230b adjacent to central web 222 by threading into tapped risers 234 integrally formed on both sides of the central web. The outer PCBs 230c and 230d are attached to a tapped end 238 of spacing fasteners 232 by threaded screws 236 which thread into the tapped ends. To protect the outer PCBs 230c and 230d, a protective panel 239 is attached to each side of CXCM 66 by a single central fastener 237. Protective panels are also provided with perforations 108 to permit air flow through CXCM 66.

As illustrated in FIG. 4, a horizontally mounted interboard connector backplane 242 is received through frame 224 and attached via electrical connectors 248 to a side edge of PCB's 230. Interboard connector 242 is adapted to electrically interconnect PCB's 230a through 230d to one another. To protect interboard connector 242, a transparent protective cover 244 is received in a perimeter groove 246 formed in frame member 224.

Figure 16:
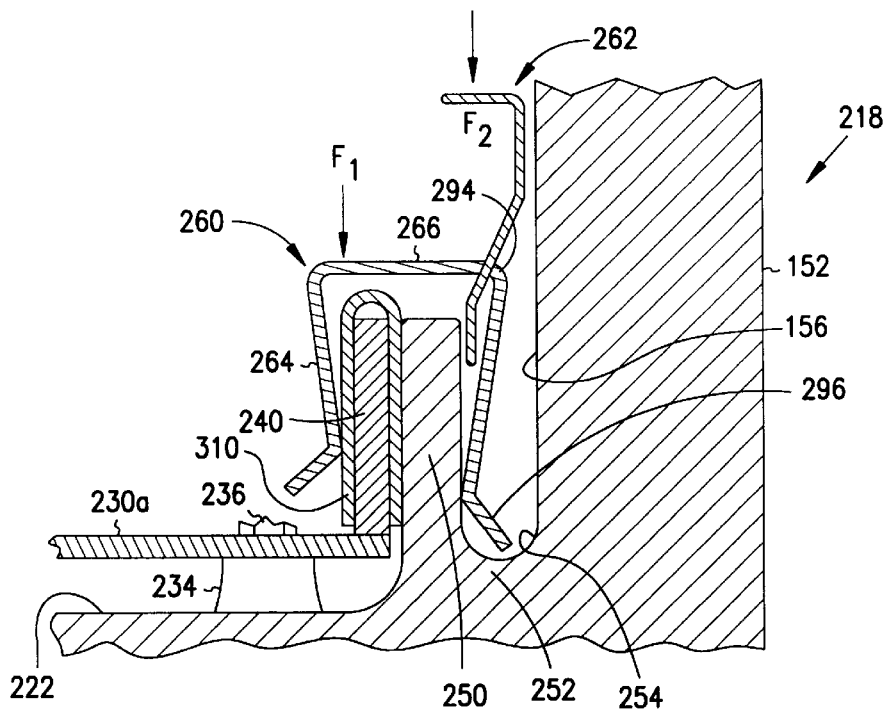
FIG. 16 shows a cross sectional view of a portion of the common electronics module of FIG. 3 illustrating the thermal conductive path of the spring clamp arrangement.

As illustrated in FIG. 16, PCB 230a includes a plurality of electronic power packages 240 which generate a large amount of waste heat when operating. It is preferable to mount such packages 240 adjacent one edge of the board so that the packages are conductively connected to the board and adjacent cover plate 152. It is within the scope of the present invention to have a similar arrangement on the other inner PCB 230b as well.

FIG. 16 illustrates an apparatus intended to provide a thermal conductive path between electronic packages 240 and housing 218. The apparatus is described herein and shown in FIGS. 16 and 19. To provide a connection to housing 218, a projecting rib or heat sink 250 is provided extending from central web 222. Heat sink 250 includes a lower section 252 bridging heat sink 250 at least in part to inside surface 156 of cover plate 152. Heat sink 250 and lower section 252 define a well 254 between cover plate 152 and the heat sink.

Figure 19:
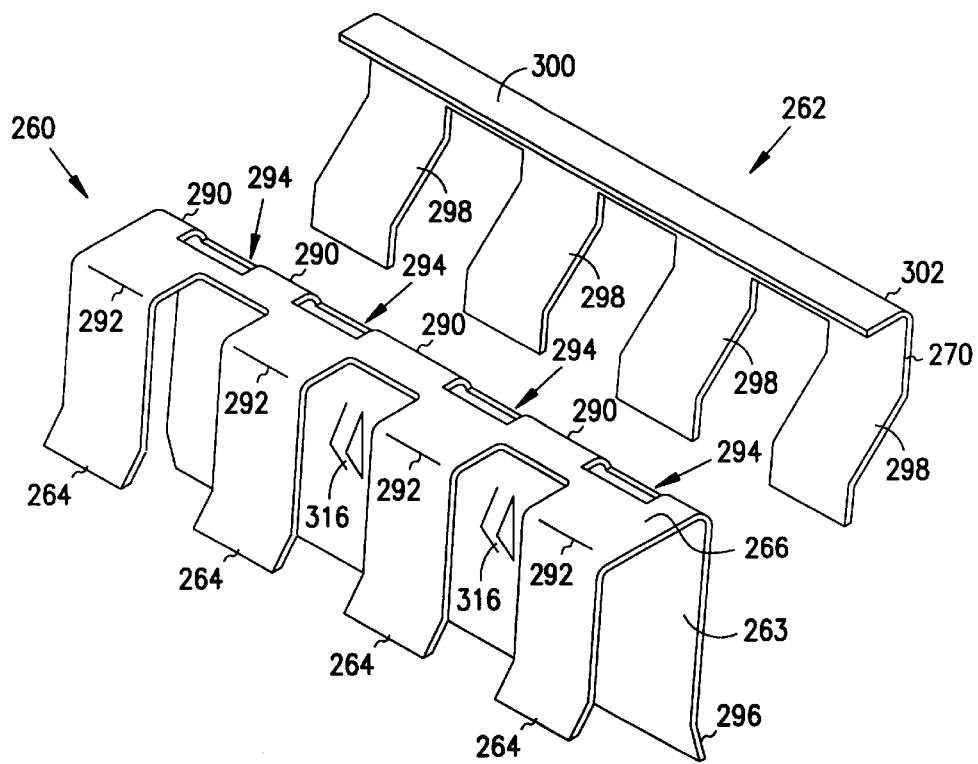
FIG. 19 shows a perspective view of the two spring clamp members of FIG. 16.
Figure 17:
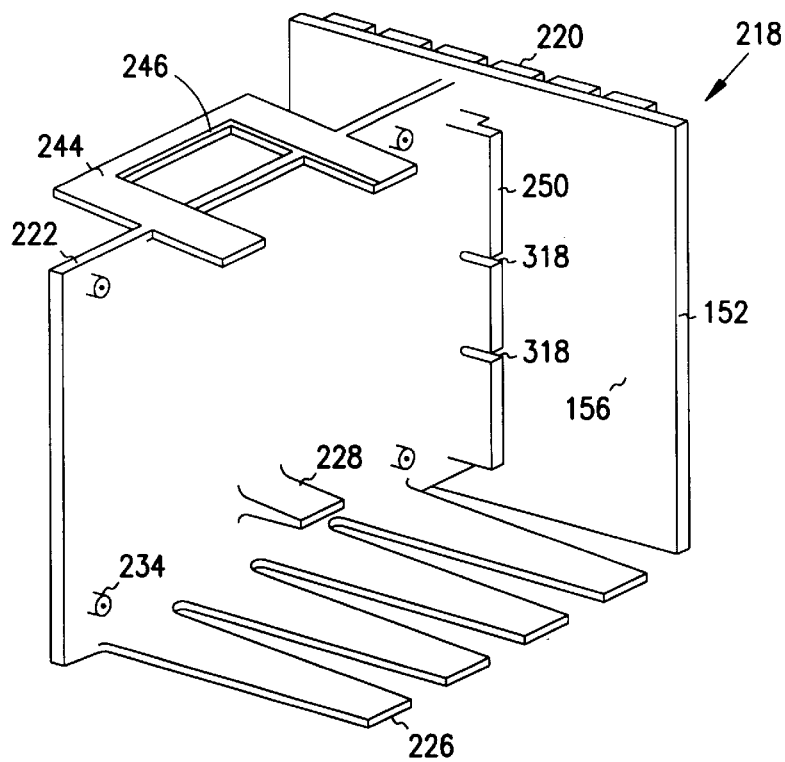
FIG. 17 shows a perspective view of the structural frame of the common electronics module of FIG. 3.
Figure 18:
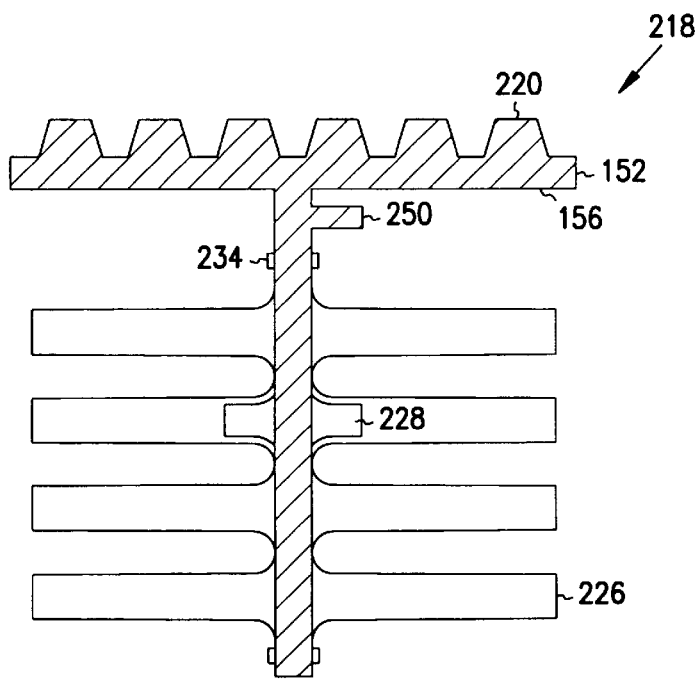
FIG. 18 shows a cross sectional view of the structural frame taken along line 18—18 of FIG. 17.

FIG. 16 illustrates the thermally conductive apparatus for PCB 230a in cross-section and as installed in CXCM 66. The apparatus has a spring member 260 and a wedge member 262 installed over heat sink 250 and heat producing electronic packages 240. Spring member 260 is a one-piece structure with an elongate back panel 263 and a top member 266 with a first longitudinal bend 290 therebetween. A plurality of spring fingers 264 extend from top member 266 and bend downward spaced from and generally parallel to back panel 264 along a second longitudinal bend 292. Fingers 264, however, are not necessarily parallel to back panel 264 as is illustrated in FIG. 16, but the spring member generally has a U-shaped cross section. The spring fingers 264 extend part way into top member 266 as illustrated in FIG. 19. Each of spring fingers 264 may have individually tailored spring rates for properly loading its corresponding electronic package 240 when installed. Spring member 260 also includes a plurality of slots 294 formed partially in top member 266 and partially in back panel 263 along first bend 290. Back panel 263 has a footer 296 formed along the bottom edge of back panel 263 bent away from fingers 264.

Wedge member 262 is a one-piece structure having a plurality of curved projections 298 extending from an elongate body section 270. Wedge member 262 also includes a top beam 300 extending from body section 270 along a first bend line 302. Curved projections 298 bend relative to body section 270 in the same direction that top beam extends forming the curve of the wedge member. Projections 298 are intended to be received within slots 294 of spring member 260 when installed and therefore must be sized and spaced accordingly.

Both members 260 and 262 are constructed from heat treated stainless steel to provide excellent anti-corrosive properties and the desired spring rates. As will be evident to those skilled in the art, the members may be constructed from other suitable materials such as beryllium, copper, nickel silver or the like without departing from the scope of the present invention.

Spring member 260 is inserted over packages 240 and heat sink 250 as illustrated in FIG. 16. The spring rate and spacing from back panel 263 of each finger 264 is designed to initially provide a zero insertion force, shown as arrow "F1" for easy assembly and to prevent damage to the soldering of packages 240 on PCB 230a. Footer 296 is intended to seat within well 254.

Wedge member 262 is then inserted between back panel 263 and heat sink 250 by inserting projections 298 through slots 294 and applying a downward force "F2" to top beam 300. The curve of wedge member 262 variably increases the load applied to back panel 263 pushing it against inside surface 156 of cover plate 152 as spring member 260 pivots about footer 296. Wedge member 262 loads each package 240 and pushes them against heat sink 250 as the wedge is inserted. Wedge member 262 contacts cover plate 152 along first bend 290 providing a direct thermal path therto as well as filling any gap between packaes 240 and heat sink 250. Wedge member may be provided with a detente position by adding appropriate bends to the members to lock it in place once inserted.

Spring and wedge members 260 and 262 provide a manufacturing aid by providing a mechanism which clamps the heat producing packages all at once instead of one at a time and by reducing the number of parts to do so. The members 260 and 262 also provide an anti-vibration element for PCB 230a protecting them and the electronic components thereon from damage when MISU 38 is subjected to external stimulation. To further protect packages 250, a thermall conductive and electrically insulative heat sink pad 310 may be added around each package as shown in FIG. 16. A die stamped prong 316 may be formed in back panel 263 of spring member 260 for use as a positioning guide when inserting the spring member over the heat sink 250 and packages 240. A guide slot 318 is included on heat sink 250 for receiving each guide prong 316 therein.

MISU 38 provides the needed multiple dwelling or business multiplexing-demultiplexing features while protecting the components held inside. The enclosure 60 dissipates heat through conduction, convection and radiation. Air is permitted to flow throughout the enclosure over the components to carry heat to the enclosure. Heat may also conduct directly from the components through chassis and the various attachment points to the enclosure. Heat also radiates from the components to the enclosure and radiates from the radiating fin structure of the enclosure to atmosphere.

As will be evident to those skilled in the art, the MISU described herein may take on a variety of constructions and configurations. The embodiments described herein are for illustrative purposes and to describe the presently known best mode of practicing the invention. It is intended that the invention be limited in scope only by the appended claims and their permissible equivalents.

What is claimed is:

1. An integrated service unit for servicing multiple dwelling locatins for a telecommunications system, said service unit comprising:
    an enclosure having a back panel, a removable front cover, a top and a bottom panel, and opposed first and second sides;
    a plug-in coaxial common electronics module removably received within said first side, said common electronics module having a structural housing with a cover plate for closing off said first side of said enclosure;
    at least one channel unit removably received within said second side;
    a closable access panel for closing off said second side of said enclosure; and
    a plurality of radiating fins on said enclosure constructed and arranged to dissipate heat from within said enclosure generated in part by said common electronics module and said at least one channel unit.

2. The integrated service unit of claim 1 wherein said common electronics unit further comprises a plurality of radiating fins on an exterior surface of said cover plate constructed and arranged to dissipate heat generated by said common electronics module and said at least one channel unit.

3. The integrated service unit of claim 2 wherein said common electronics module further comprises a central web extending from an inside surface of said cover plate and at least one printed circuit board mounted to said central web.

4. The integrated service unit of claim 3 wherein said central web comprises a heat sink formed thereon for thermally conducting heat from said at least one printed circuit board through said structural housing to said radiating fins on said cover plate.

5. The integrated service unit of claim 4 wherein said common electronics module further comprises an apparatus attached to said at least one printed circuit board and to said heat sink.

6. The integrated service unit of claim 5 wherein said apparatus comprises:
    a spring member for engaging a plurality of electronic packages on said at least one printed circuit board and said heat sink, said spring member having an elongate back panel, a plurality of spring fingers disposed spaced from and generally parallel to said back panel and being integrally attached to said back panel along a curved top member, and a plurality of slots formed in said spring member; and
    a wedge member for insertion between said back panel of said spring member and said heat sink through said slots, said wedge member having an elongate body and a plurality of curved projections for variably increasing the amount of load applied to said back panel of said spring member when said projections are inserted through said slots.

7. The integrated service unit of claim 1 wherein said enclosure is constructed from a material such as aluminum.

8. The integrated service unit of claim 1 wherein said structural frame member of said common electronics module is constructed from a material such as aluminum.

9. The integrated service unit of claim 1 wherein said back panel, said top and bottom panels, and said first and second sides of said enclosure are formed as a one-piece integral structure.

10. The integrated service unit of claim I wherein said bottom panel includes a removable video tap plate thereon.

11. The integrated service unit of claim 1 wherein said enclosure includes a compressible grommet of a rubber like material disposed between said front cover and said enclosure.

12. The integrated service unit of claim 11 wherein said grommet includes three adjacent and parallel seal lips running longitudinally along said grommet.

13. The integrated service unit of claim 12 wherein said grommet is received in a grommet channel defined between said front cover and said enclosure, wherein said channel limits the compression of said grommet to a predetermined thickness.

14. The integrated service unit of claim 1 wherein said enclosure further comprises a compressible grommet of a rubber like material disposed between said cover plate of said common electronics module and said enclosure.

15. A coaxial common electronics module adapted to plug into an integrated service unit, said module comprising:
    a structural housing having a cover plate adapted to secure said module to said integrated service unit, a vertically oriented central web extending from said cover plate, and a heat sink integrally formed on siad housing;

a plurality of printed circuit boards carried adjacent said central web adapted to plug into said integrated service unit;

an interboard connector carried by said central web for electrically connecting said plurality of printed circuit boards together;

a plurality of electronic packages carried by one of said boards adjacent said cover plate; and an apparatus for thermally conducting heat from said packages to said heat sink.

* * * * *